(12) United States Patent
Shi

(10) Patent No.: US 11,540,388 B2
(45) Date of Patent: Dec. 27, 2022

(54) FLEXIBLE CIRCUIT BOARD COMPONENT AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventor: Wei Shi, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/224,123

(22) Filed: Apr. 7, 2021

(65) Prior Publication Data

US 2021/0227688 A1 Jul. 22, 2021

(30) Foreign Application Priority Data

Dec. 21, 2020 (CN) .......................... 202011533970.X

(51) Int. Cl.
*H05K 1/02* (2006.01)
*H05K 1/18* (2006.01)

(52) U.S. Cl.
CPC ........... *H05K 1/0281* (2013.01); *H05K 1/189* (2013.01); *H05K 2201/09027* (2013.01);
(Continued)

(58) Field of Classification Search
CPC .... H05K 1/0281; H05K 1/0393; H05K 1/118; H05K 1/189; H05K 1/028;
(Continued)

(56) References Cited

U.S. PATENT DOCUMENTS

| | | | |
|---|---|---|---|
| 2014/0307396 A1* | 10/2014 | Lee .................. | H05K 1/189 29/830 |
| 2017/0025733 A1* | 1/2017 | Kato ................ | H05K 1/0242 |

FOREIGN PATENT DOCUMENTS

| | | |
|---|---|---|
| CN | 109062333 A | 12/2018 |
| CN | 110517590 A | 11/2019 |
| CN | 110191578 B | 5/2020 |

* cited by examiner

*Primary Examiner* — Roshn K Varghese
(74) *Attorney, Agent, or Firm* — Kilpatrick Townsend & Stockton LLP

(57) ABSTRACT

Disclosed are a flexible circuit board component and a display device. The flexible circuit board component includes a flexible circuit board and a foam structure. The flexible circuit board includes a first area and a second area which are arranged in a first direction and connected to each other. The foam structure is located on a side of the first area in the flexible circuit board, and includes a first foam and a second foam, and in the first direction, the second foam is located between the first foam and the second area. After the flexible circuit board component is affixed to a non-light-emitting display side of a display panel, in a direction perpendicular to an interface of the foam structure and the flexible circuit board, a height of the second foam on a side adjacent to the second area is less than a height of the first foam.

7 Claims, 9 Drawing Sheets

(52) U.S. Cl.
CPC .............. *H05K 2201/10128* (2013.01); *H05K 2201/10151* (2013.01); *H05K 2201/2009* (2013.01)

(58) Field of Classification Search
CPC . H05K 2201/2009; H05K 2201/09027; H05K 2201/10121; H05K 2201/10151; H05K 2201/10128; H05K 2201/0116
See application file for complete search history.

FLEXIBLE CIRCUIT BOARD COMPONENT AND DISPLAY DEVICE

CROSS-REFERENCE TO RELATED APPLICATIONS

This application claims priority to Chinese Patent Application No. 202011533970.X filed Dec. 21, 2020, the disclosure of which is incorporated herein by reference in its entirety.

FIELD

The present disclosure relates to the field of display technology, and in particular to a flexible circuit board component and a display device.

BACKGROUND

Along with the development of science and technology and the progress of society, the degree of dependence of people on the aspects of information exchange, transmission and the like is ever increasing, and a display device serving as a main carrier and a material basis for information exchange and transmission has become a hot spot for research of many scientists.

At present, an optical element such as a fingerprint identification module and an ambient light sensor are often arranged on a back surface of a display screen of the display device such as a mobile phone, and the optical element may be connected to a mainboard through a flexible circuit board, may convert an optical signal received by the optical element into an electric signal and then transmit the electric signal to the mainboard.

SUMMARY

The present disclosure provides a flexible circuit board component and a display device, which reduces a bending stress of a flexible circuit board and avoids the flexible circuit board from driving a foam structure to warp.

In one embodiment of the present disclosure provides a flexible circuit board component. The flexible circuit board component includes a flexible circuit board and a foam structure. The flexible circuit board includes a first area and a second area arranged in a first direction and connected to each other. The foam structure is located on a side of the first area in the flexible circuit board, and includes a first foam and a second foam; and in the first direction, the second foam is located between the first foam and the second area. After the flexible circuit board component is affixed to a non-light-emitting display side of a display panel, in a direction perpendicular to an interface of the foam structure and the flexible circuit board, a height of the second foam on a side adjacent to the second area is less than a height of the first foam.

In one embodiment of the present disclosure provides a display device. The display device includes a display panel and the flexible circuit board component described in some embodiment. The flexible circuit board component is affixed to a non-light-emitting display side of the display panel, and the foam structure is located between the flexible circuit board and the display panel In the embodiments of the present disclosure, the foam structure is arranged on the first area of the flexible circuit board, no foam structure is arranged on the second area of the flexible circuit board, and after the flexible circuit board component is affixed to the non-light-emitting display side of the display panel, the first area has a larger height due to the existence of the foam structure; a height of the first area is larger than that of the second area. The foam structure includes the first foam and the second foam, and after the flexible circuit board component is affixed to the non-light-emitting display side of the display panel, the height of the second foam on the side adjacent to the second area is less than the height of the first foam.

DETAILED DESCRIPTION

Figure 1:
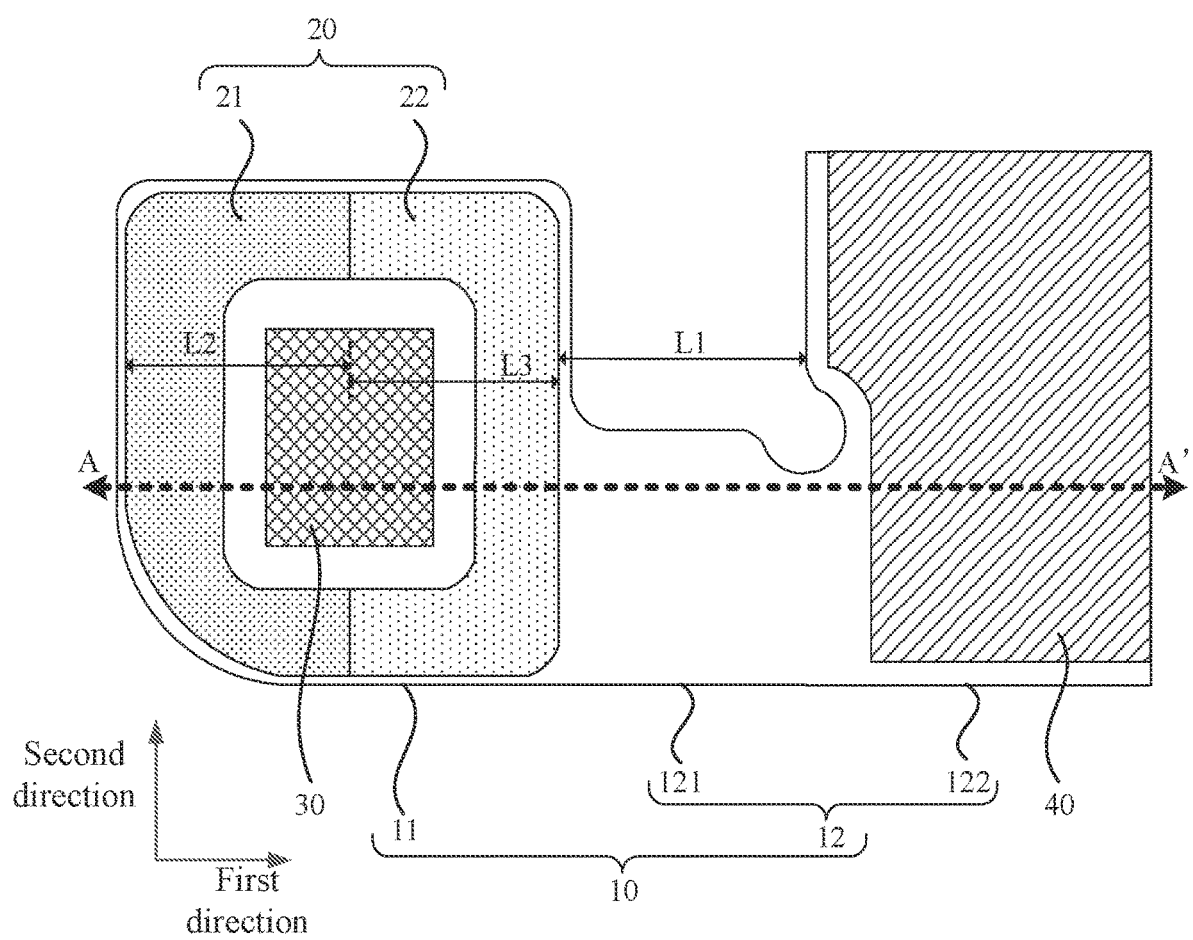
FIG. 1 is a top structural schematic diagram of a flexible circuit board component provided in an embodiment of the present disclosure.

The present disclosure will be further described in detail in conjunction with the drawings and embodiments below. It should be understood that the embodiments described herein are merely used for explaining the present disclosure and are not intended to limit the present disclosure. It should also be noted that, for ease of description, only some, but not all, of the structures related to the present disclosure are shown in the drawings.

A foam is usually disposed between a flexible circuit board and a display screen, and the foam wraps an optical element to protect the optical element. However, a height of the flexible circuit board at a position where the foam exists is large, the height of the flexible circuit board at a position where the foam does not exist is small, and a height difference exists at different positions of the flexible circuit board, so that the flexible circuit board has a bending stress, and further the flexible circuit board easily drives the foam to warp and becomes invalid.

Figure 2:
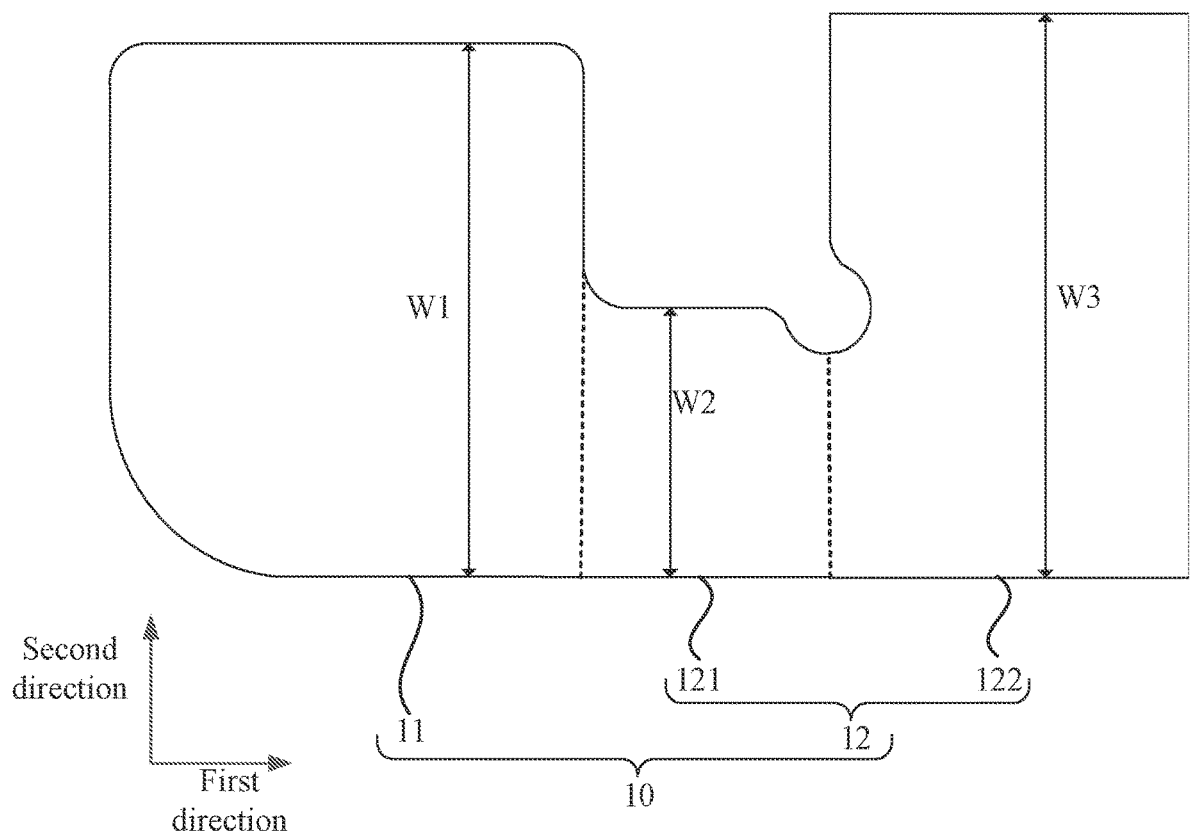
FIG. 2 is a top structural schematic diagram of a flexible circuit board provided in an embodiment of the present disclosure.
Figure 3:
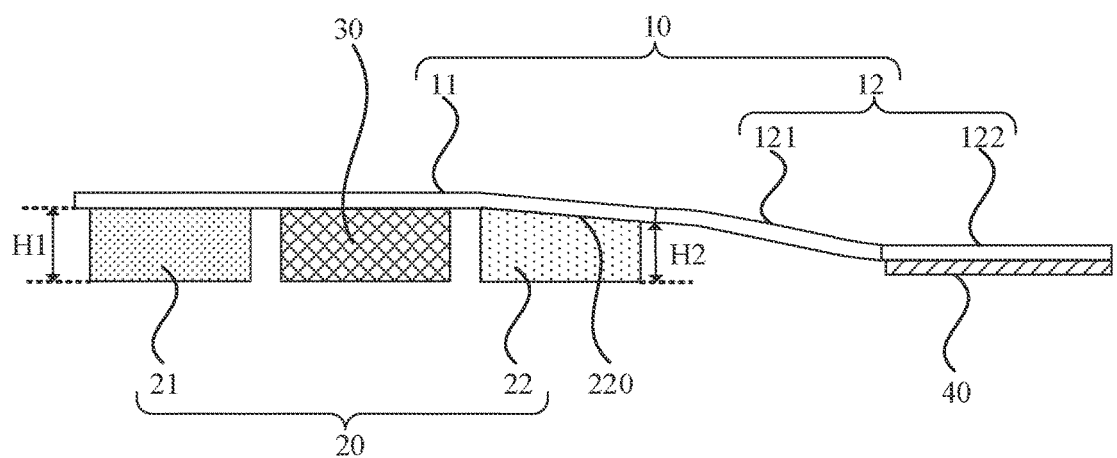
FIG. 3 is a schematic cross-sectional structure diagram in an AA' direction in FIG. 1.

FIG. 1 is a top structural schematic diagram of a flexible circuit board component provided in an embodiment of the present disclosure, FIG. 2 is a top structural schematic diagram of a flexible circuit board provided in an embodiment of the present disclosure, FIG. 3 is a schematic cross-sectional structure diagram in an AA' direction in FIG. 1, and with reference to FIGS. 1, 2 and 3, the flexible circuit board component includes a flexible circuit board 10 and a foam structure 20. The foam structure 20 is fixed to the flexible circuit board 10. The flexible circuit board 10 includes a first area 11 and a second area 12 which are arranged in a first direction and connected to each other. It should be noted that a dashed line drawn in FIG. 2 is an auxiliary line, which is only to clearly illustrate the first area 11 and the second area 12, in fact, the first area 11 and the second area 12 are different portions in a same flexible circuit board 10, and a same trace in the flexible circuit board 10 may extend uninterruptedly from the first area 11 into the second area 12. The foam structure 20 is located on a side of the first area 11 in the flexible circuit board 10, i.e., the foam structure 20 is located on the first area 11. The foam structure 20 includes a first foam 21 and a second foam 22, and the first foam 21 and the second foam 22 are enclosed to form an annular cavity. The foam structure 20 is annular in a direction perpendicular to an interface of the foam structure 20 and the flexible circuit board 10. After the flexible circuit board 10 blocks a side of the foam structure 20, the foam structure 20 and the flexible circuit board 10 form a groove. In the first direction, the second foam 22 is located between the first foam 21 and the second area 12. After the flexible circuit board component is affixed to a non-light-emitting display side of a display panel, and in the direction perpendicular to the interface of the foam structure 20 and the flexible circuit board 10, a height of the second foam 22 on a side adjacent to the second area 12 is less than a height of the first foam 21.

In the embodiments of the present disclosure, the foam structure 20 is arranged on the first area 11 of the flexible circuit board 10, no foam structure 20 is arranged on the second area 12 of the flexible circuit board 10, and after the flexible circuit board component is affixed to the non-light-emitting display side of the display panel, the first area 11 has a larger height due to the existence of the foam structure 20; a height of the first area 11 is larger than that of the second area 12. The foam structure 20 includes the first foam 21 and the second foam 22, and after the flexible circuit board component is affixed to the non-light-emitting display side of the display panel, the height of the second foam 22 on the side adjacent to the second area 12 is less than the height of the first foam 21. Therefore, a height difference between the first area 11 and the second area 12 is reduced, a lever fulcrum which bends and warps the flexible circuit board moves in a direction directed from the second area 12 to the first area 11, a length of an arm of force on a side of the second area 12 is increased, an upward bouncing force of the flexible circuit board 10 is reduced, and thus, a bending stress of the flexible circuit board 10 is reduced, and the flexible circuit board 10 is avoided from driving the foam structure 20 to warp. It should be noted that the height of the second foam 22 itself on the side adjacent to the second area 12 may be less than the height of the first foam 21, i.e., before the flexible circuit board component is affixed to the non-light-emitting display side of the display panel, the height of the second foam 22 itself on the side adjacent to the second area 12 is less than the height of the first foam 21. In other embodiments, before the flexible circuit board component is affixed to the non-light-emitting display side of the display panel, the height of the second foam 22 on the side adjacent to the second area 12 may be less than, equal to or larger than the height of the first foam 21. After the flexible circuit board component is affixed to the non-light-emitting display side of the display panel, the second foam 22 deforms, so that the height of the second foam 22 on the side adjacent to the second area 12 is less than the height of the first foam 21.

In an embodiment, with reference to FIGS. 1, 2 and 3, a material density of the second foam 22 is less than a material density of the first foam 21. In the embodiments of the present disclosure, the material density of the first foam 21 is larger, the first foam 21 is not easily deformed, while the material density of the second foam 22 is smaller, and the second foam 22 is more easily deformed. The first foam 21 provides a supporting force for the flexible circuit board 10, and prevents a groove formed by the flexible circuit board 10 and the foam structure 20 from being compressed excessively. After the flexible circuit board component is affixed to the non-light-emitting display side of the display panel, the second foam 22 deforms, so that the height of the second foam 22 on the side adjacent to the second area 12 is less than the height of the first foam 21.

In an embodiment, a ratio of the material density of the first foam 21 to the material density of the second foam 22 is greater than or equal to 3. In the embodiments of the present disclosure, a mass of the first foam 21 within a unit volume is three times and more than three times of a mass of the second foam 22 within the unit volume. Therefore, compared with the first foam 21, the second foam 22 is smaller in the material density and more easily deformed, and after the flexible circuit board component is affixed to the non-light-emitting display side of the display panel, the second foam 22 may generate a larger deformation amount due to pressure, so that the height difference between the first area 11 and the second area 12 is further reduced, and the upward bouncing force of the flexible circuit board 10 is reduced, the bending stress of the flexible circuit board 10 is reduced, and the flexible circuit board 10 is avoided from driving the foam structure 20 to warp.

Figure 4:
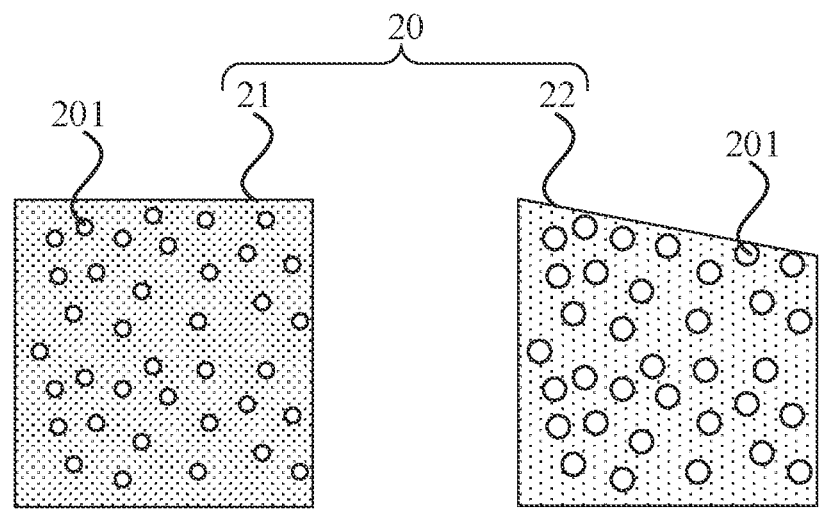
FIG. 4 is a schematic cross-sectional structure diagram of a foam structure provided in an embodiment of the present disclosure.

FIG. 4 is a schematic cross-sectional structure diagram of a foam structure provided in an embodiment of the present disclosure, with reference to FIG. 4, the first foam 21 and the second foam 22 each include multiple dispersed and three-dimensionally distributed pores 201. It should be understood that the foam is a material foamed by plastic particles, and after the plastic particles are foamed, multiple pores are formed inside the plastic particles. In one embodiment, the multiple pores 201 are formed in the first foam 21 and the second foam 22, so that the first foam 21 and the second foam 22 have elasticity and have a degree of deformation under pressure. As shown in FIG. 4, within a unit volume, a volume of each of the multiple pores 201 in the first foam 21 is less than a volume of each of the multiple pores 201 in the second foam 22. Due to a fact that the pores 201 in the first foam 21 are smaller in volume, the material density of the first foam 21 is large, and the first foam 21 is not easily deformed. The pores 201 in the second foam 22 are larger in volume, the material density of the second foam 22 is smaller, and the second foam 22 is easily deformed.

Figure 5:
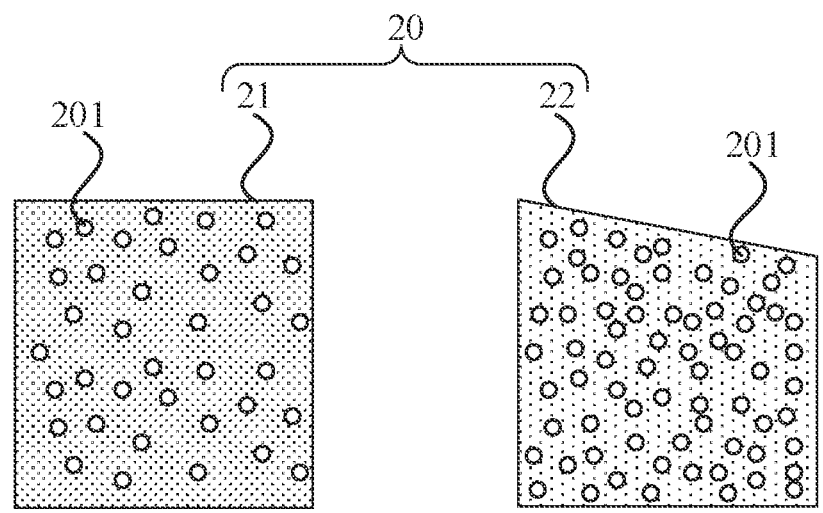
FIG. 5 is a schematic cross-sectional structure diagram of another foam structure provided in an embodiment of the present disclosure.

FIG. 5 is a schematic cross-sectional structure diagram of another foam structure provided in an embodiment of the present disclosure, with reference to FIG. 5, within the unit volume, a number of the pores 201 in the first foam 21 is less than a number of the pores 201 in the second foam 22. As shown in FIG. 5, within the unit volume, since the number of the pores 201 in the first foam 21 is smaller, the material density of the first foam 21 is larger, and the first foam 21 is not easily deformed; a number of the pores 201 in the second foam 22 is larger, the material density of the second foam 22 is smaller, and the second foam 22 is easily deformed.

It should be noted that within the unit volume, when the volume of the pores 201 in the first foam 21 is less than the volume of the pores 201 in the second foam 22, the number of the pores 201 in the first foam 21 may be equal to the number of the pores 201 in the second foam 22. Within the unit volume, when the number of the pores 201 in the first foam 21 is less than that of the pores 201 in the second foam 22, the volume of the pores 201 in the first foam 21 may be equal to that of the pores 201 in the second foam 22. In another embodiment, within the unit volume, the volume of the pores 201 in the first foam 21 is less than the volume of the pores 201 in the second foam 22, and the number of the pores 201 in the first foam 21 is less than the number of the pores 201 in the second foam 22.

With continued reference to FIGS. 1 and 3, the flexible circuit board component further includes an optical element 30. The optical element 30 is fixed to the flexible circuit board 10 and located within the annular cavity of the foam structure 20. The optical element 30 is also located within the groove formed by the flexible circuit board 10 and the foam structure 20. The foam structure 20 is disposed around the optical element 30 for a circle. In a direction perpendicular to the interface of the foam structure 20 and the flexible circuit board 10, the first foam 21 provides the supporting force for the flexible circuit board 10 to prevent the groove formed by the flexible circuit board 10 and the foam structure 20 from being compressed excessively, so that the height of the first foam 21 is larger than or equal to a height of the optical element 30, and therefore the optical element 30 is protected against damage.

In one embodiment, the optical element 30 includes an ambient light sensor that collects intensity of external ambient light irradiated thereon and transmits intensity information of the external ambient light to a mainboard (not shown in the drawings), and the mainboard may adjust a display brightness of the display panel according to the received intensity information of the external ambient light.

Figure 6:
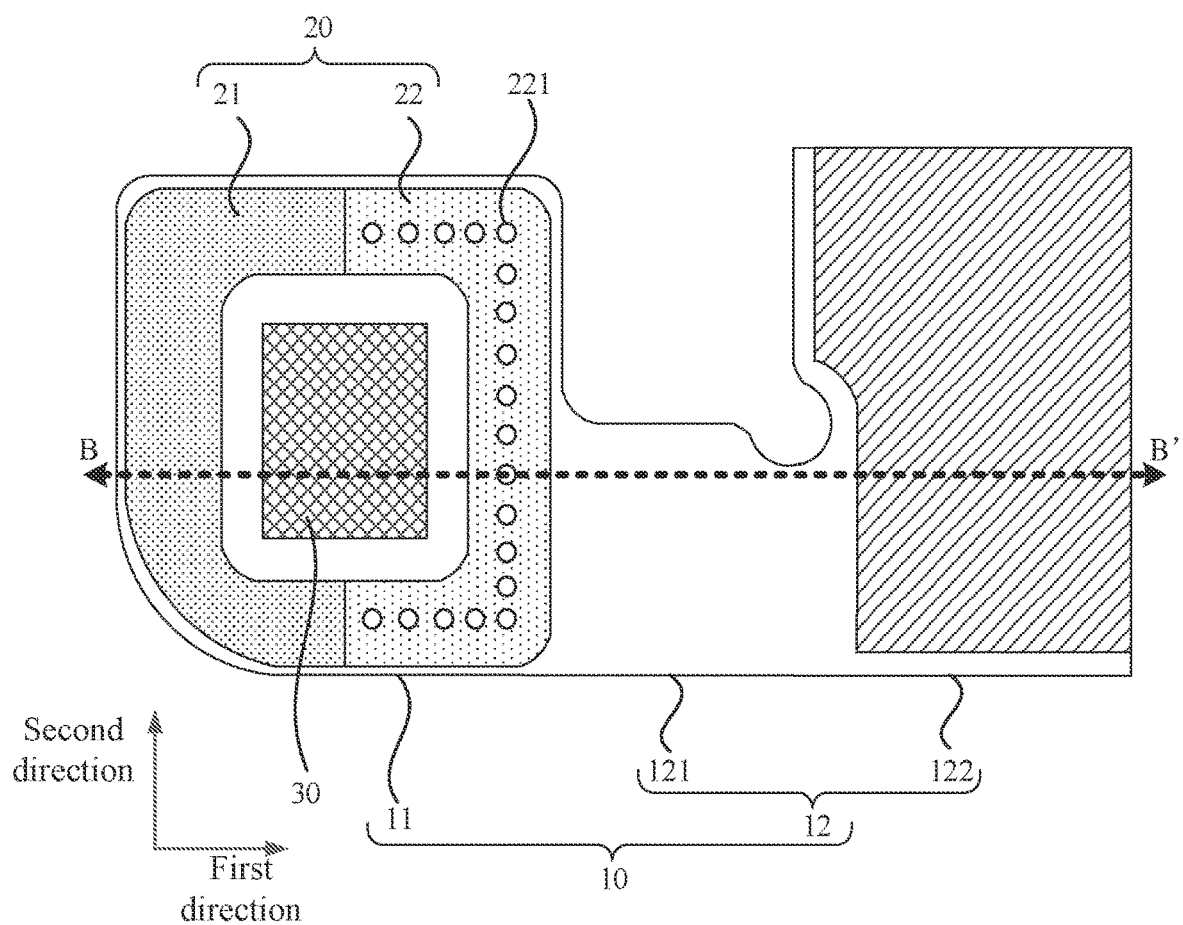
FIG. 6 is a top structural schematic diagram of another flexible circuit board component provided in an embodiment of the present disclosure.
Figure 7:
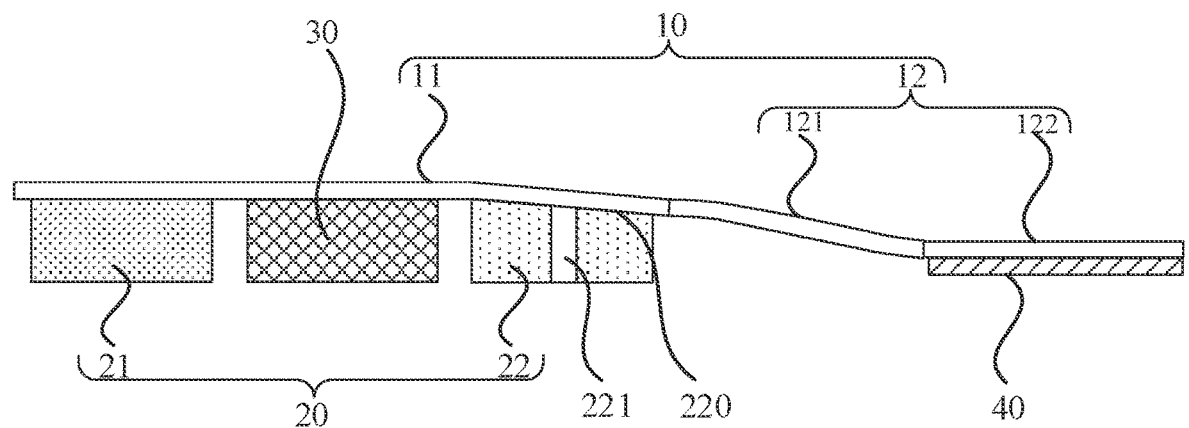
FIG. 7 is a schematic cross-sectional structure diagram in a BB' direction in FIG. 6.

FIG. 6 is a top structural schematic diagram of another flexible circuit board component provided in an embodiment of the present disclosure, FIG. 7 is a schematic cross-sectional structure diagram in a BB' direction in FIG. 6. With reference to FIGS. 6 and 7, the second foam 22 includes multiple first through holes 221, an extending direction of the first through holes 221 is perpendicular to the interface of the foam structure 20 and the flexible circuit board 10. The first through holes 221 penetrate through the second foam 22 in the direction perpendicular to the interface of the foam structure 20 and the flexible circuit board 10, an end of the first through hole 221 is located on a surface of a side of the second foam 22 away from the flexible circuit board 10, and another end of the first through hole 221 is located on a surface of a side of the second foam 22 adjacent to the flexible circuit board 10. In the embodiments of the present disclosure, on the basis of the above embodiments, the second foam 22 further includes multiple first through holes 221 in a vertical direction, so that the second foam 22 is more easily deformed when subjected to pressure. On the other hand, the extending direction of the first through holes 221 is perpendicular to the interface of the foam structure 20 and the flexible circuit board 10, so that the foam structure 20 is completely closed in any direction parallel to the interface of the foam structure 20 and the flexible circuit board 10, and external light is avoided from being laterally transmitted to the optical element 30.

Figure 8:
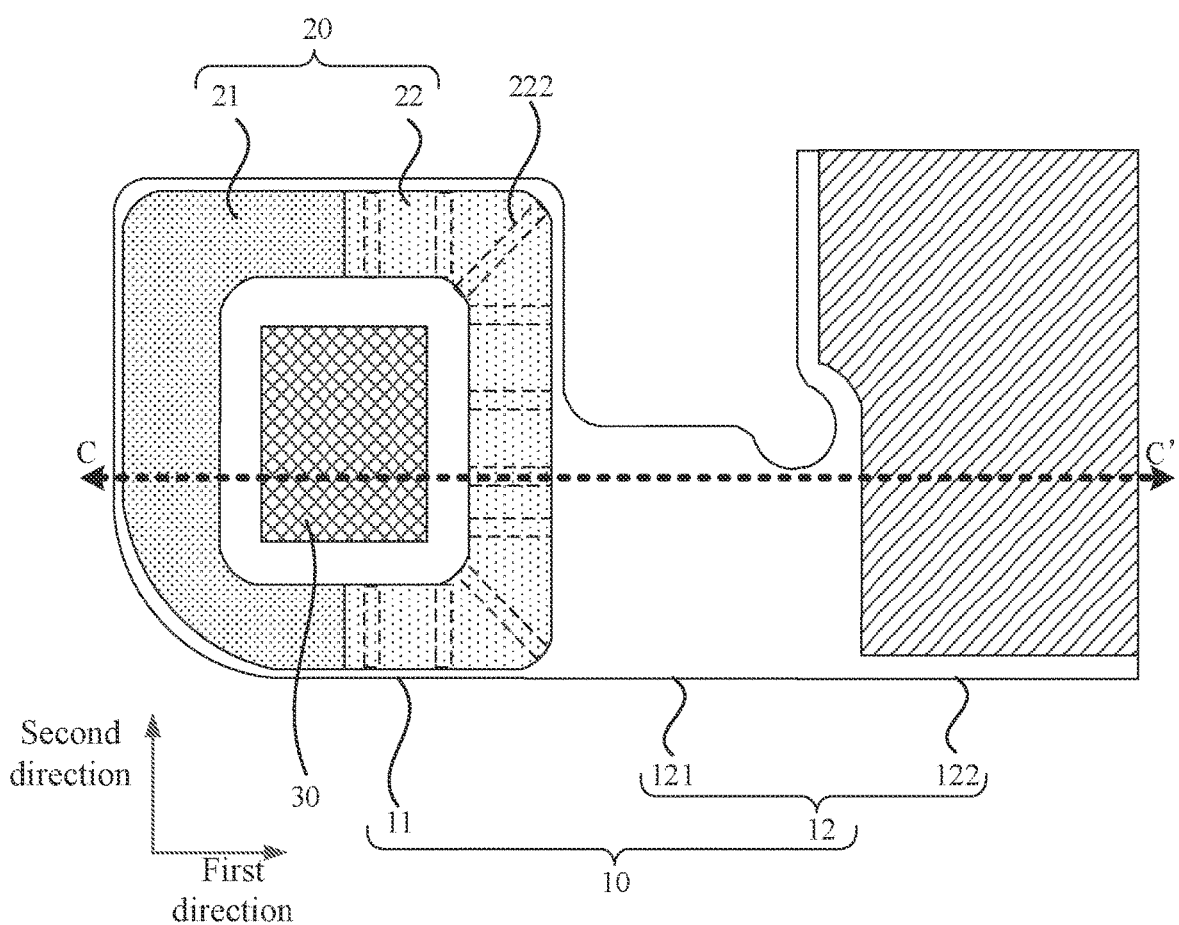
FIG. 8 is a top structural schematic diagram of another flexible circuit board component provided in an embodiment of the present disclosure.
Figure 9:
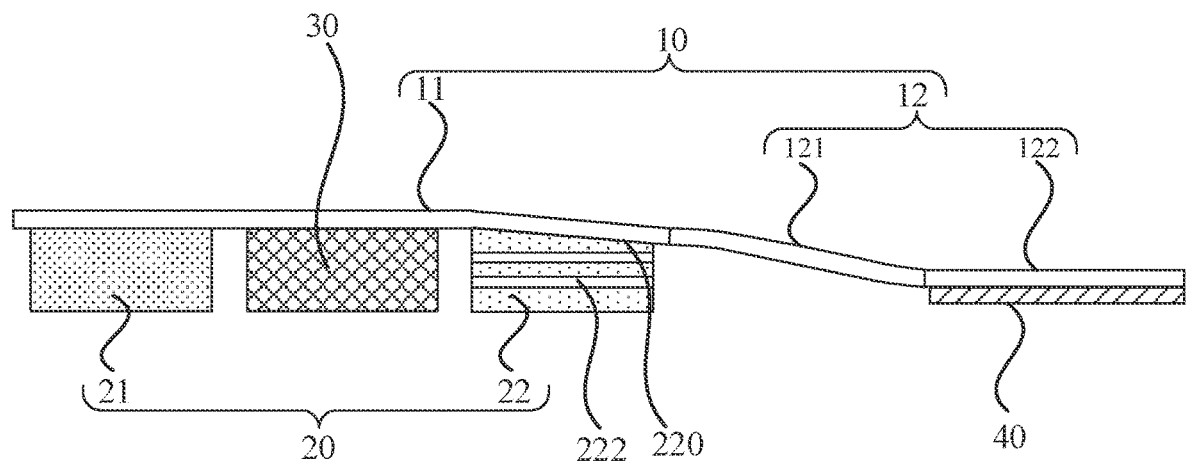
FIG. 9 is a schematic cross-sectional structure diagram in a CC' direction in FIG. 8.

FIG. 8 is a top structural schematic diagram of another flexible circuit board component provided in an embodiment of the present disclosure, and FIG. 9 is a schematic cross-sectional structure diagram in a CC' direction in FIG. 8. With reference to FIGS. 8 and 9, the second foam 22 includes multiple second through holes 222, an extending direction of the second through holes 222 is parallel to the interface of the foam structure 20 and the flexible circuit board 10. The second through holes 222 penetrate through the second foam 22 in a direction parallel to the interface of the foam structure 20 and the flexible circuit board 10, an end of the second through hole 222 is located on a surface of a side of the second foam 22 away from a center of the annular cavity, and another end of the second through hole 222 is located on a surface of a side of the second foam 22 adjacent to the center of the annular cavity. In the embodiments of the present disclosure, on the basis of the above embodiments, the second foam 22 further includes multiple second through holes 222 in a horizontal direction, and the extending direction of the second through holes 222 is parallel to the interface of the foam structure 20 and the flexible circuit board 10, so that the second foam 22 is more easily deformed when subjected to a pressure in the direction perpendicular to the interface of the foam structure 20 and the flexible circuit board 10.

In one embodiment, with reference to FIGS. 8 and 9, the multiple second through holes 222 are arranged in the direction perpendicular to the interface of the foam structure 20 and the flexible circuit board 10, it should be understood that in the direction perpendicular to the interface of the foam structure 20 and the flexible circuit board 10, a number of the second through holes 222 is greater, the second through holes 222 are more easily deformed when subjected to the pressure in the direction perpendicular to the interface of the foam structure 20 and the flexible circuit board 10.

In other embodiments, the second foam 22 may further include multiple first through holes 221 and multiple second through holes 222, the extending direction of the first through holes 221 is perpendicular to the interface of the foam structure 20 and the flexible circuit board 10, and the extending direction of the second through holes 222 is parallel to the interface of the foam structure 20 and the flexible circuit board 10.

With continued reference to FIGS. 1 and 3, in the direction perpendicular to the interface of the foam structure 20 and the flexible circuit board 10, the height of the first foam 21 is H1, and the height of the second foam 22 on the side adjacent to the second area 12 is H2; H1 and H2 satisfy following formula: $1<H1/H2\leq1.25$. In the embodiments of the present disclosure, the height of the second foam 22 on the side adjacent to the second area 12 is less than that of the first foam 21, and a ratio of the height of the first foam 21 to the height of the second foam 22 on the side adjacent to the second area 12 is less than or equal to 1.25, so that the second foam 22 is not too low, and the foam structure 20 is prevented from being excessively compressed; and a situation that the optical element 30 is damaged due to pressure is avoided.

With reference to FIGS. 1 and 3, the second foam 22 includes a foam ramp 220 directed from the first area 11 to the second area 12, and a height of the foam ramp 220 gradually decreases in the first direction. The height of the foam ramp 220 refers to a vertical distance between the foam ramp 220 and a side of the second foam 22 away from the flexible circuit board 10. In the embodiments of the present disclosure, the second foam 22 includes the foam ramp 220 directed from the first area 11 to the second area 12, so that the flexible circuit board 10 may extend along the foam ramp 220, a height of the flexible circuit board 10 on the foam ramp 220 is gradually reduced, and thus the height difference between the first area 11 and the second area 12 is reduced, and the bending stress of the flexible circuit board 10 is reduced, and the flexible circuit board 10 is avoided from driving the foam structure 20 to warp. It should be noted that the foam ramp 220 may be a ramp formed by processing the second foam 22, or a ramp formed by pressure deformation of the second foam 22 after the flexible circuit board component is affixed to the non-light-emitting display side of the display panel.

Figure 10:
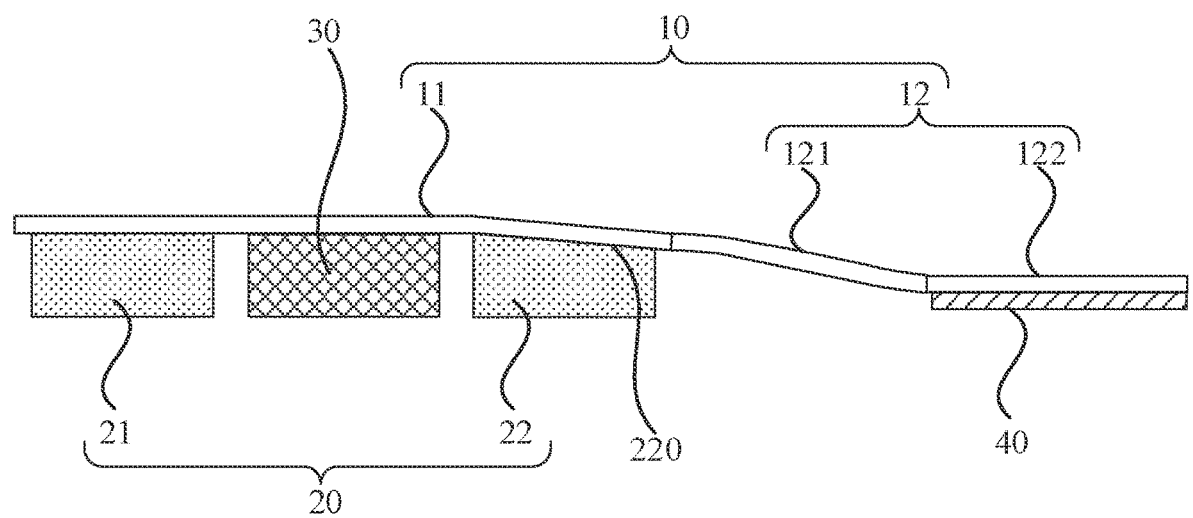
FIG. 10 is a schematic cross-sectional structure diagram of another flexible circuit board component provided in an embodiment of the present disclosure.

FIG. 10 is a schematic cross-sectional structure diagram of another flexible circuit board component provided in an embodiment of the present disclosure, with reference to FIG. 10, the material density of the first foam 21 is equal to the material density of the second foam 22, the second foam 22 includes the foam ramp 220 directed from the first area 11 to the second area 12, and the height of the foam ramp 220 gradually decreases in the first direction. In the embodiments of the present disclosure, the first foam 21 and the second foam 22 have a same material density, and the foam ramp 220 is formed on the second foam 22. Due to a fact that the material density of the first foam 21 is equal to that of the second foam 22, the first foam 21 and the second foam 22 may be made of a same material, so that the material selection difficulty for manufacturing the first foam 21 and the second foam 22 is reduced, and the process for manufacturing the foam structure 20 is simplified.

With continued reference to FIGS. 1, 2 and 3, in the first direction, a distance between an edge of the first foam 21 on a side away from the second foam 22 and a center of the annular cavity is L2, and a distance between an edge of the second foam 22 on a side away from the first foam 21 and the center of the annular cavity is L3. The center of the annular cavity refers to a geometric center of the annular cavity in the direction perpendicular to the interface of the foam structure 20 and the flexible circuit board 10. Moreover, L2 and L3 satisfy following formula: $1 \leq L3/L2 \leq 3$. In the embodiments of the present disclosure, the second foam 22 occupies at least half of the foam structure 20, so that a proportion of the foam structure 20 occupied by the second foam 22 is not too low, and the second foam 22 is ensured to have enough stress release capability for the flexible circuit board 10 to reduce the bending stress of the flexible circuit board 10. Moreover, $L3/L2 \leq 3$, as such, a proportion of the foam structure 20 occupied by the first foam 21 is not too low, the foam structure 20 is prevented from being excessively compressed, and a situation that the optical element 30 is damaged due to pressure is avoided.

With reference to FIGS. 1, 2, and 3, the second area 12 includes a first sub-area 121 and a second sub-area 122, the first sub-area 121 connects the first area 11 and the second sub-area 122. In the first direction, the first sub-area 121 is located between the first area 11 and the second sub-area 122. A height of the first area 11 is greater than a height of the second sub-area 122, it should be noted that the height of the first area 11 refers to a distance between the first area 11 and the display panel, and the height of the second sub-area 122 refers to a distance between the second sub-area 122 and the display panel. The first sub-area 121 is a climbing area and directs from the first area 11 to the second area 12, and the height of the first sub-area 121 is gradually reduced in the first direction. The bending stress of the flexible circuit board 10 occurs primarily in the first sub-area 121. In a direction perpendicular to the first direction, a width of the first area 11 and a width of the second sub-area 122 are both larger than a width of the first sub-area 121.

In one embodiment, with reference to FIGS. 1, 2, and 3, in the second direction, the width of the first area 11 is W1, the width of the first sub-area 121 is W2, and the width of the second sub-area 122 is W3, the first direction is perpendicular to the second direction. In addition, following formulas are satisfied: W2<W1, W2<W3. In the second direction, the width W1 of the first area 11 may be greater than, equal to, or less than the width W3 of the second sub-area 122.

With reference to FIGS. 1, 2, and 3, the height of the first foam 21 is H1 in the direction perpendicular to the interface of the foam structure 20 and the flexible circuit board 10. In the first direction, a distance between an edge of the foam structure 20 on a side adjacent to the second sub-area 122 and an edge of the second sub-area 122 on a side adjacent to the foam structure 20 is L1. L1 and H1 satisfy following formula: $L1/H1 \geq 4$. In the embodiments of the present disclosure, $L1/H1 \geq 4$, since the height of the second foam 22 on the side adjacent to the second area 12 is less than that of the first foam 21, so that a distance between the edge of the foam structure 20 on the side adjacent to the second sub-area 122 and the edge of the second sub-area 122 on the side adjacent to the foam structure 20 is at least 4 times of the height of the second foam 22 on the side adjacent to the second area 12. Therefore, the distance between the edge of the foam structure 20 on the side adjacent to the second sub-area 122 and the edge of the second sub-area 122 on the side adjacent to the foam structure 20 is long enough, whereby a length of an arm of force on a side of the second area 12 is increased, an upward bouncing force of the flexible circuit board 10 is reduced, and thus, a bending stress of the flexible circuit board 10 is reduced, and the flexible circuit board 10 is avoided from driving the foam structure 20 to warp.

In one embodiment, with reference to FIGS. 1, 2, and 3, the flexible circuit board component further includes an adhesive tape 40, the adhesive tape 40 is located on a same side of the flexible circuit board 10 with the foam structure 20, the adhesive tape 40 is located in the second sub-area 122 for adhering the flexible circuit board 10 to the non-light-emitting display side of the display panel. In the direction perpendicular to the interface of the foam structure 20 and the flexible circuit board 10, the height of the edge of the second area 12 on the side adjacent to the second area 12 is larger than a height of the adhesive tape 40. In fact, the height of the adhesive tape 40 is much less than a thickness of the foam structure 20, so that a height difference between the first area 11 and the second sub-area 122 is created, and the bending stress is easily generated in the first sub-area 121. It should be noted that in an embodiment, a side of the foam structure 20 away from the flexible circuit board 10 may have tackiness, and the foam structure 20 may be directly adhered to the non-light-emitting display side of the display panel. In another embodiment, the flexible circuit board component further includes a bonding layer, the bonding layer is located on a side of the foam structure 20 away from the flexible circuit board 10, and the foam structure 20 may be adhered to the non-light-emitting display side of the display panel through the bonding layer.

Figure 11:
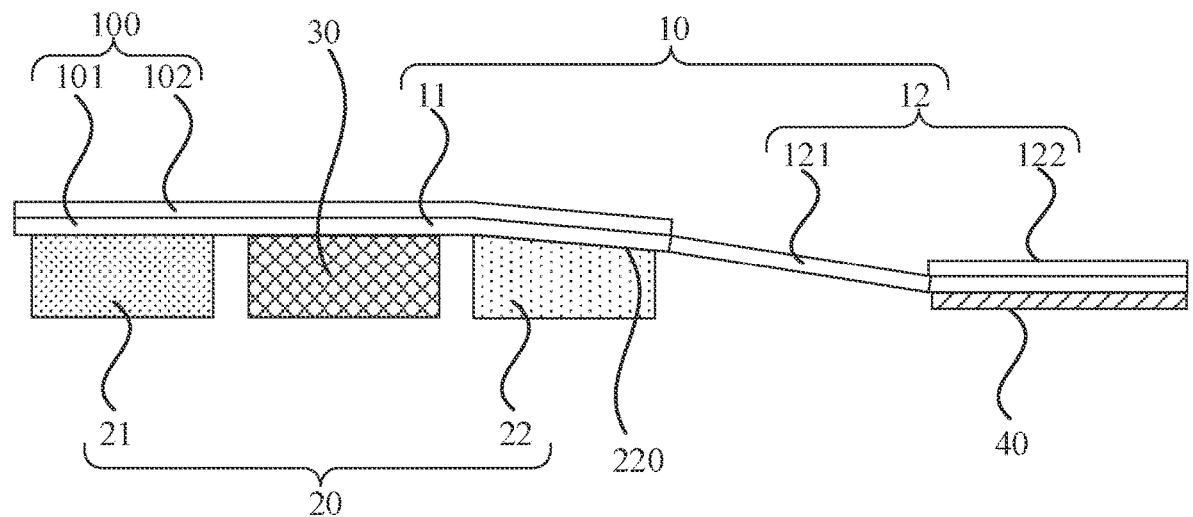
FIG. 11 is a schematic cross-sectional structure diagram of another flexible circuit board component provided in an embodiment of the present disclosure.

FIG. 11 is a schematic cross-sectional structure diagram of another flexible circuit board component provided in an embodiment of the present disclosure, with reference to FIG. 11, the flexible circuit board 10 includes at least two wiring layers 100. Two adjacent wiring layers 100 are insulated from each other. The flexible circuit board 10 is provided with all wiring layers 100 in the first area 11 and the second sub-area 122. In the first sub-area 121, the flexible circuit board 10 is provided with a single wiring layer 100. In the embodiments of the present disclosure, the flexible circuit board 10 includes the all wiring layers 100 in the first area 11 and the second sub-area 122, so that the normal use of the flexible circuit board 10 is not affected, and only one wiring layer 100 is disposed in the first sub-area 121, so that the thickness of the first sub-area 121 in the flexible circuit board 10 is reduced, and the first sub-area 121 of the flexible circuit board 10 is softer; the bending stress is not easy to accumulate, and the flexible circuit board 10 is avoided from driving the foam structure 20 to warp.

In one embodiment, the flexible circuit board 10 includes a first wiring layer 101 and a second wiring layer 102, the first area 11 and the second sub-area 122 each include a first wiring layer 101 and a second wiring layer 102, and the first sub-area 121 includes only the first wiring layer 101.

Figure 12:
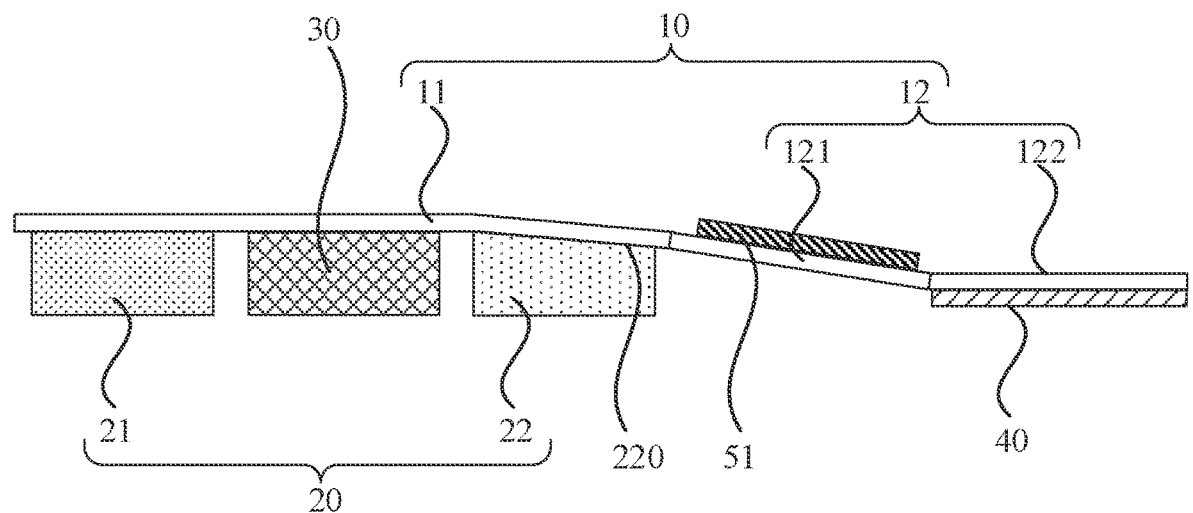
FIG. 12 is a schematic cross-sectional structure diagram of another flexible circuit board component provided in an embodiment of the present disclosure.

FIG. 12 is a schematic cross-sectional structure diagram of another flexible circuit board component provided in an embodiment of the present disclosure, with reference to FIG. 12, the flexible circuit board component further includes a first reinforcing plate 51, the first reinforcing plate 51 is located on the first sub-area 121, and the first reinforcing plate 51 is fixed to a side of the flexible circuit board 10. In the embodiments of the present disclosure, the first reinforcing plate 51 is also fixed on the first sub-area 121 of the flexible circuit board 10, so that the bending stress generated on the first sub-area 121 may be absorbed by the first reinforcing plate 51, and the flexible circuit board 10 is avoided from driving the foam structure 20 to warp.

In one embodiment, with reference to FIG. 12, the first reinforcing plate 51 is fixed to a side of the flexible circuit board 10 away from the foam structure 20, i.e., the first reinforcing plate 51 and the foam structure 20 are located on opposite sides of the flexible circuit board 10. In other embodiments, the first reinforcing plate 51 and the foam structure 20 may also be located on the same side of the flexible circuit board 10.

Figure 13:
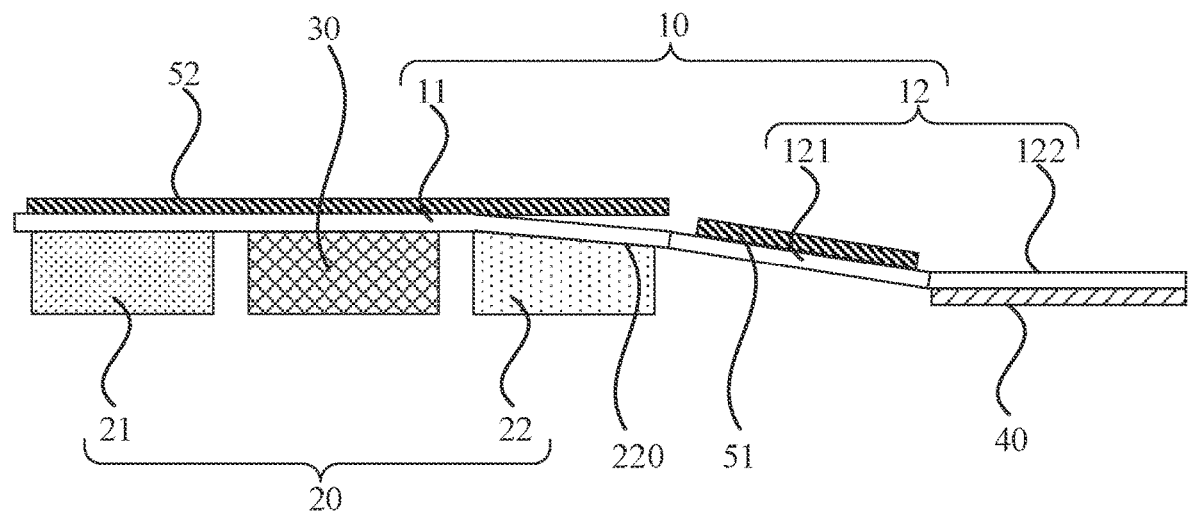
FIG. 13 is a schematic cross-sectional structure diagram of another flexible circuit board component provided in an embodiment of the present disclosure.

FIG. 13 is a schematic cross-sectional structure diagram of another flexible circuit board component provided in an embodiment of the present disclosure, with reference to FIG. 13, the flexible circuit board component further includes a second reinforcing plate 52, the second reinforcing plate 52 is located on the first area 11, and the first reinforcing plate 51 and the second reinforcing plate 52 are both fixed to the side of the flexible circuit board 10 away from the foam structure 20. In the embodiments of the present disclosure, the flexible circuit board component further includes a second reinforcing plate 52, the second reinforcing plate 52 provides support for the first area 11 of the flexible circuit board 10 and the optical element 30, facilitating electrical connection of the optical element 30 to the first area 11 in the flexible circuit board 10. In addition, the first reinforcing plate 51 and the second reinforcing plate 52 are arranged on the same side of the flexible circuit board 10, so that the first reinforcing plate 51 and the second reinforcing plate 52 may be manufactured and formed by using the same material, and the first reinforcing plate 51 and the second reinforcing plate 52 may be fixed with the flexible circuit board 10 conveniently in a same process, simplifying the process flow.

Figure 14:
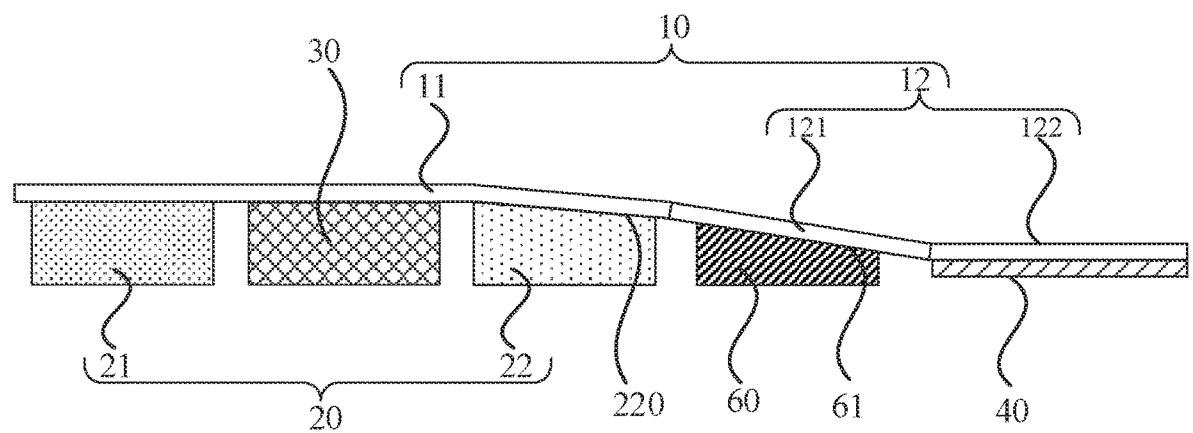
FIG. 14 is a schematic cross-sectional structure diagram of another flexible circuit board component provided in an embodiment of the present disclosure.

FIG. 14 is a schematic cross-sectional structure diagram of another flexible circuit board component provided in an embodiment of the present disclosure, and with reference to FIG. 14, the flexible circuit board component further includes an auxiliary structure 60, the auxiliary structure 60 and the foam structure 20 are located on the same side of the flexible circuit board 10, and the auxiliary structure 60 is located in the first sub-area 121. The auxiliary structure 60 includes an auxiliary ramp 61 directed from the first area 11 to the second sub-area 122, and a height of the auxiliary ramp 61 gradually decreases in the first direction. The height of the auxiliary ramp 61 refers to a vertical distance between the auxiliary ramp 61 and a side of the auxiliary structure 60 away from the flexible circuit board 10. In the embodiments of the present disclosure, the first sub-area 121 in the flexible circuit board 10 is further provided with the auxiliary structure 60, the auxiliary structure 60 includes the auxiliary ramp 61 directed from the first area 11 to the second area 12, the flexible circuit board 10 may extend along the auxiliary ramp 61, and the height of the flexible circuit board 10 on the auxiliary ramp 61 is gradually reduced, to reduce the bending stress of the first sub-area 121 in the flexible circuit board 10, and avoid the flexible circuit board 10 from driving the foam structure 20 to warp.

In one embodiment, with reference to FIG. 14, the second foam 22 includes the foam ramp 220 directed from the first area 11 to the second area 12, and the height of the foam ramp 220 gradually decreases in the first direction. The auxiliary structure 60 includes an auxiliary ramp 61 directed from the first area 11 to the second sub-area 122, and the height of the auxiliary ramp 61 gradually decreases in the first direction. The first area 11 may extend along the foam ramp 220 and gradually decrease in height, and the first sub-area 121 may extend along the auxiliary ramp 61 and gradually decrease in height.

In an embodiment, with reference to FIG. 14, the auxiliary structure 60 is of the same material as the second foam 22. In the embodiments of the present disclosure, the auxiliary structure 60 and the second foam 22 are located on the same side of the flexible circuit board 10, and when the auxiliary structure 60 and the second foam 22 are made of the same material, the auxiliary structure 60 and the second foam 22 may be formed simultaneously in the same process, so that the process is saved.

In one embodiment, with reference to FIG. 14, there is a gap between the auxiliary structure 60 and the second foam 22. The auxiliary structure 60 and the second foam 22 are two separate units. In other embodiments, when the auxiliary structure 60 and the second foam 22 are of the same material, the auxiliary structure 60 and the second foam 22 may also be integrally connected, i.e., the auxiliary structure 60 and the second foam 22 are integrally formed.

Figure 15:
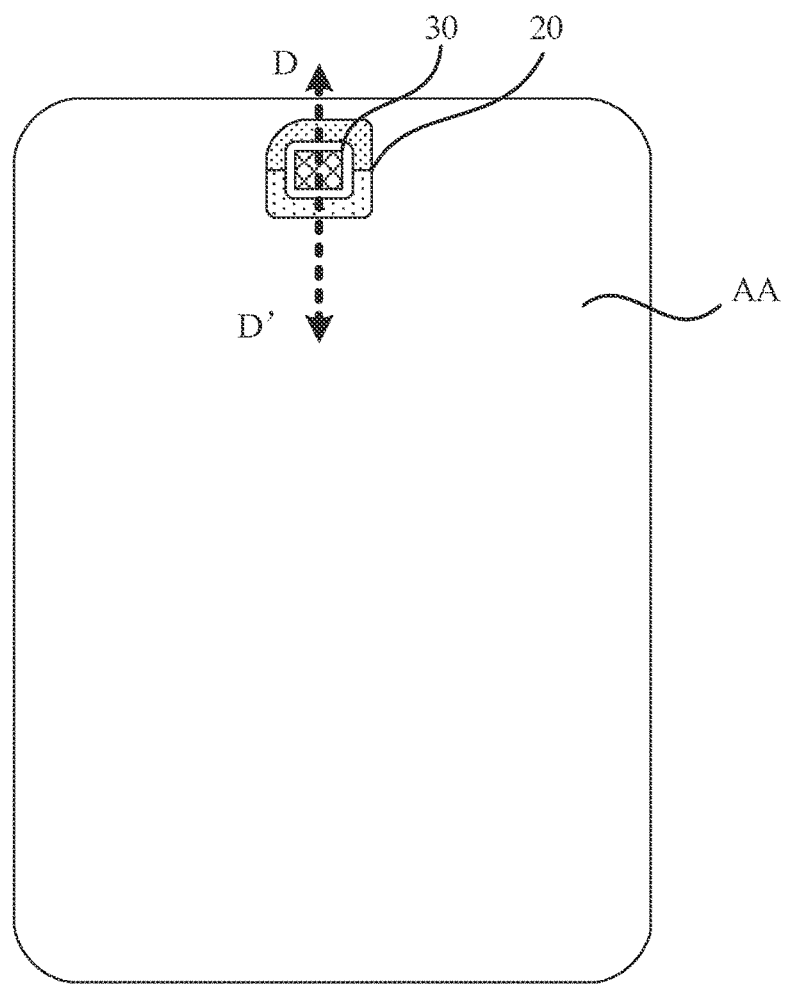
FIG. 15 is a top structural schematic diagram of a display device provided in an embodiment of the present disclosure.
Figure 16:
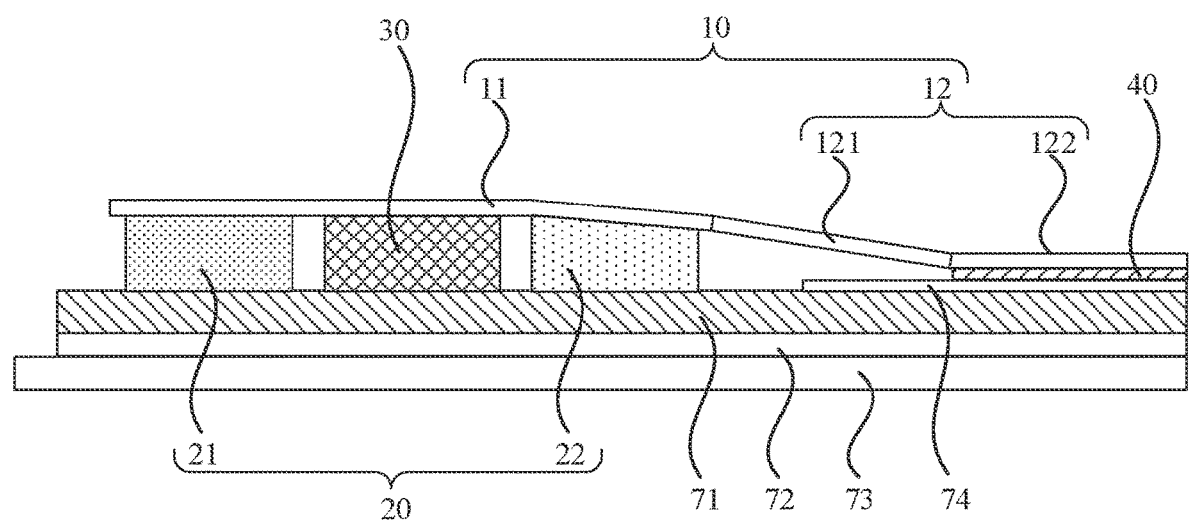
FIG. 16 is a schematic cross-sectional structure diagram in a DD' direction in FIG. 15.

FIG. 15 is a top structural schematic diagram of a display device provided in an embodiment of the present disclosure, FIG. 16 is a schematic cross-sectional structure diagram in a DD' direction in FIG. 15, with reference to FIGS. 15 and 16, the display device includes a display panel 71 and the flexible circuit board component in the embodiments described above, the flexible circuit board component is affixed to the non-light-emitting display side of the display panel 71, and the foam structure 20 is located between the flexible circuit board 10 and the display panel 71. The foam structure 20 is disposed between the first area 11 of the flexible circuit board 10 and the display panel 71, which has a relatively large height; no foam structure 20 is disposed between the second area 12 of the flexible circuit board 10 and the display panel 71, which has a relatively small height, and the vertical distance between the first area 11 and the display panel 71 is larger than the vertical distance between the second area 12 and the display panel 71. Since the display device in the embodiments of the present disclosure includes the flexible circuit board component in the above embodiments, so that after the flexible circuit board component is affixed to the non-light-emitting display side of the display panel, the height of the second foam 22 on the side adjacent to the second area 12 is less than that of the first foam 21 in the direction perpendicular to the interface of the foam structure 20 and the flexible circuit board 10. Therefore, the height difference between the first area 11 and the second area 12 is reduced, the lever fulcrum which bends and warps the flexible circuit board moves in the direction directed from the second area 12 to the first area 11, whereby a length of an arm of force on a side of the second area 12 is increased, an upward bouncing force of the flexible circuit board 10 is reduced, and thus, a bending stress of the flexible circuit board 10 is reduced, and the flexible circuit board 10 is avoided from driving the foam structure 20 to warp.

In one embodiment, with reference to FIGS. 15 and 16, the display panel 71 includes a display area AA, the optical element 30 is located within the display area AA, the optical element 30 is located on a non-light-emitting display side of the display panel 71, external ambient light passes through the display panel 71 to reach the optical element 30 located on a back surface of the display panel 71, and the optical element 30 may achieve functions such as ambient light sensing.

In one embodiment, with reference to FIGS. 15 and 16, the display device may further include an optical glue layer 72 and a cover plate 73, both of the optical glue layer 72 and the cover plate are located on the light-emitting display side of the display panel 71, i.e., both of the optical glue layer 72 and the cover plate 73 are located on a side of the display panel 71 away from the flexible circuit board 10. The optical glue layer 72 is located between the display panel 71 and the cover plate 73 and used for adhering and fixing the display panel 71 and the cover plate 73. The display device may further include a near field communication element 74, the near field communication element 74 is fixed to the non-light-emitting display side of the display panel 71, and the flexible circuit board 10 is adhered and fixed to the near field communication element 74 through the adhesive tape 40. The near field communication element 74 is located between the adhesive tape 40 and the display panel 71, and the adhesive tape 40 is located between the near field communication element 74 and the flexible circuit board 10.

What is claimed is:

1. A flexible circuit board component, comprising:
   a flexible circuit board, wherein the flexible circuit board comprises a first area and a second area arranged in a first direction and connected to each other; and
   a foam structure, wherein the foam structure is located on a side of the first area in the flexible circuit board, and comprises a first foam and a second foam; and in the first direction, the second foam is located between the first foam and the second area;
   wherein after the flexible circuit board component is affixed to a non-light-emitting display side of a display panel, in a direction perpendicular to an interface of the foam structure and the flexible circuit board, a height of the second foam on a side adjacent to the second area is less than a height of the first foam,
   wherein the flexible circuit board component comprises at least one of:
   a material density of the second foam is less than a material density of the first foam, or
   the second foam comprises a plurality of first through holes, and an extending direction of the plurality of first through holes is perpendicular to the interface of the foam structure and the flexible circuit board, or
   the second foam comprises a plurality of second through holes, and an extending direction of the plurality of second through holes is parallel to the interface of the foam structure and the flexible circuit board, or
   in the direction perpendicular to the interface of the foam structure and the flexible circuit board, the height of the first foam is H1, and the height of the second foam on the side adjacent to the second area is H2; and wherein 1<H1/H2≤1.25, or
   the second foam comprises a foam ramp directed from the first area to the second area, and a height of the foam ramp gradually decreases in the first direction, or
   the first foam and the second foam are enclosed to form an annular cavity; and in the first direction, a distance between an edge of the first foam on a side away from the second foam and a center of the annular cavity is L2, and a distance between an edge of the second foam on a side away from the first foam and the center of the annular cavity is L3, wherein 1≤L3/L2≤3.

2. The flexible circuit board component of claim 1, wherein a ratio of the material density of the first foam to the material density of the second foam is greater than or equal to 3.

3. The flexible circuit board component of claim 1, wherein the first foam and the second foam each comprise a plurality of pores which are dispersed and three-dimensionally distributed, wherein at least one of following conditions exists: within a unit volume, a volume of each of the plurality of pores in the first foam is less than a volume of each of the plurality of pores in the second foam, or a number of the plurality of pores in the first foam is less than a number of the plurality of pores in the second foam.

4. A flexible circuit board component, comprising:
   a flexible circuit board, wherein the flexible circuit board comprises a first area and a second area arranged in a first direction and connected to each other; and
   a foam structure, wherein the foam structure is located on a side of the first area in the flexible circuit board, and comprises a first foam and a second foam; and in the first direction, the second foam is located between the first foam and the second area;
   wherein after the flexible circuit board component is affixed to a non-light-emitting display side of a display panel, in a direction perpendicular to an interface of the foam structure and the flexible circuit board, a height of the second foam on a side adjacent to the second area is less than a height of the first foam wherein the second area comprises a first sub-area and a second sub-area, the first sub-area connects the first area and the second sub-area; in a direction perpendicular to the first direction, a width of the first area and a width of the second sub-area are both larger than a width of the first sub-area,
   wherein the flexible circuit board component comprises at least one of:
   in the direction perpendicular to the interface of the foam structure and the flexible circuit board, the height of the first foam is H1; in the first direction, a distance between an edge of the foam structure on a side adjacent to the second sub-area and an edge of the second sub-area on a side adjacent to the foam structure is L1; and wherein L1/H1≥4, or the flexible circuit board comprises at least two wiring layers; and in the first area and the second sub-area, the flexible circuit board is provided with the wiring layer; and in the first sub-area, the flexible circuit board is provided with a single wiring layer of the at least two wiring layers, or the flexible circuit board comprises a first reinforcing plate located in the first sub-area and fixed on a side of the flexible circuit board, or the flexible circuit board comprises an auxiliary structure, wherein the auxiliary structure is located on a same side of the flexible circuit board with the foam structure and is located in the first sub-area; and the auxiliary structure comprises an auxiliary ramp directed from the first area to the second sub-area, and wherein a height of the auxiliary ramp gradually decreases in the first direction, or the first foam and the second foam are enclosed to form an annular cavity; and the flexible circuit board component further comprises an optical element fixed on the flexible circuit board and located within the annular cavity.

5. The flexible circuit board component of claim 4, further comprising a second reinforcing plate located in the first area; and wherein the first reinforcing plate and the second reinforcing plate are fixed on a side of the flexible circuit board away from the foam structure.

6. The flexible circuit board component of claim 4, wherein the auxiliary structure and the second foam are made of a same material.

7. A display device, comprising a display panel and a flexible circuit board component, wherein flexible circuit board component, comprising:

a flexible circuit board, wherein the flexible circuit board comprises a first area and a second area arranged in a first direction and connected to each other; and a foam structure, wherein the foam structure is located on a side of the first area in the flexible circuit board, and comprises a first foam and a second foam; and in the first direction, the second foam is located between the first foam and the second area;

wherein the flexible circuit board component is affixed to a non-light-emitting display side of a display panel, and in a direction perpendicular to an interface of the foam structure and the flexible circuit board, a height of the second foam on a side adjacent to the second area is less than a height of the first foam, wherein the flexible circuit board component comprises at least one of:

a material density of the second foam is less than a material density of the first foam, or the second foam comprises a plurality of first through holes, and an extending direction of the plurality of first through holes is perpendicular to the interface of the foam structure and the flexible circuit board, or the second foam comprises a plurality of second through holes, and an extending direction of the plurality of second through holes is parallel to the interface of the foam structure and the flexible circuit board, or in the direction perpendicular to the interface of the foam structure and the flexible circuit board, the height of the first foam is H1, and the height of the second foam on the side adjacent to the second area is H2; and wherein 1<H1/H2≤1.25, or wherein the second foam comprises a foam ramp directed from the first area to the second area, and a height of the foam ramp gradually decreases in the first direction, or wherein the first foam and the second foam are enclosed to form an annular cavity; and in the first direction, a distance between an edge of the first foam on a side away from the second foam and a center of the annular cavity is L2, and a distance between an edge of the second foam on a side away from the first foam and the center of the annular cavity is L3, wherein 1≤L3/L2≤3.

* * * * *